US012747671B2

(12) United States Patent

Wang et al.

(10) Patent No.: US 12,747,671 B2

(45) Date of Patent: Sep. 29, 2026

(54) FABRICATION OF COOLING HOLES USING LASER MACHINING AND ULTRASONIC MACHINING

(71) Applicant: RAYTHEON TECHNOLOGIES CORPORATION, Farmington, CT (US)

(72) Inventors: Zhigang Wang, South Windsor, CT (US); John D. Riehl, Hebron, CT (US); Andrew J. Lazur, Laguna Beach, CA (US); Robin H. Fernandez, East Haddam, CT (US); Paul F. Croteau, Columbia, CT (US); Gajawalli V. Srinivasan, South Windsor, CT (US); Ashley A. Smith, Royal Palm Beach, FL (US)

(73) Assignee: RTX CORPORATION, Farmington, CT (US)

( * ) Notice: Subject to any disclaimer, the term of this patent is extended or adjusted under 35 U.S.C. 154(b) by 0 days.

(21) Appl. No.: 17/557,224

(22) Filed: Dec. 21, 2021

(65) Prior Publication Data

US 2023/0193772 A1 Jun. 22, 2023

(51) Int. Cl.

*F01D 9/06* (2006.01)

*B23B 35/00* (2006.01)

(Continued)

(52) U.S. Cl.

CPC .............. *F01D 9/065* (2013.01); *B23B 35/00* (2013.01); *B23K 26/146* (2015.10); (Continued)

(58) Field of Classification Search

CPC . B23K 26/389; B23K 2101/001; F01D 25/12; B24B 1/04

See application file for complete search history.

(56) References Cited

U.S. PATENT DOCUMENTS 4,370,721 A * 1/1983 Berenberg ......... G05B 19/4083 700/193

4,393,292 A * 7/1983 Inoue ........................ B23H 1/08 219/69.17

(Continued)

FOREIGN PATENT DOCUMENTS

CN 106513986 3/2015

CN 106313338 A * 1/2017

(Continued)

OTHER PUBLICATIONS

CN-106313338-A machine translated description (Year: 2017).*

(Continued)

*Primary Examiner* — Michael W Hotchkiss

(74) *Attorney, Agent, or Firm* — Carlson, Gaskey & Olds, P.C.

(57) ABSTRACT

A method of machining cooling holes includes providing a workpiece in which a cooling hole is to be formed. The cooling hole, once formed, defines distinct first and second sections. The workpiece is secured in a fixture that is mounted in a first machine. In the first machine, a laser is used to drill a through-hole in a wall of the workpiece. The through-hole is spatially common to the first and second sections of the cooling hole. After drilling the through-hole, the fixture with the workpiece secured therein is removed from the first machine and mounted in a second machine. In the second machine, ultrasonic machining is used to expand a portion of the through-hole to form the second section. An abrasive slurry used in the process is drained through the through-hole during the ultrasonic machining.

6 Claims, 8 Drawing Sheets

(51) Int. Cl.

| | |
|---|---|
| ***B23K 26/146*** | (2014.01) |
| ***B23K 26/382*** | (2014.01) |
| ***B23K 101/00*** | (2006.01) |
| ***B23K 103/00*** | (2006.01) |
| ***G06F 30/20*** | (2020.01) |

(52) U.S. Cl.

CPC ............ *B23K 26/389* (2015.10); *G06F 30/20* (2020.01); *B23K 2101/001* (2018.08); *B23K 2103/52* (2018.08); *F05D 2220/32* (2013.01); *F05D 2230/13* (2013.01)

(56) References Cited

U.S. PATENT DOCUMENTS

| | | | | |
|---|---|---|---|---|
| 4,992,639 | A * | 2/1991 | Watkins | B23H 5/04 219/69.17 |
| 6,094,793 | A * | 8/2000 | Szuba | G05B 19/4083 414/800 |
| 6,483,076 | B1 * | 11/2002 | O'Loughlin | C21D 10/005 219/121.85 |
| 8,237,083 | B2 | 8/2012 | Walter et al. | |
| 9,890,647 | B2 | 2/2018 | Chamberlain et al. | |
| 11,065,715 | B2 * | 7/2021 | Hu | B23H 5/00 |
| 2004/0200807 | A1 * | 10/2004 | Forrester | B23H 7/26 219/69.17 |
| 2005/0170762 | A1 * | 8/2005 | Kostar | B24B 1/04 451/165 |
| 2005/0173388 | A1 * | 8/2005 | Lavers | B23H 9/10 205/665 |
| 2007/0289957 | A1 * | 12/2007 | Eiterer | B23K 26/0604 219/121.72 |
| 2008/0183325 | A1 * | 7/2008 | Kriegmair | B23K 26/389 408/1 R |
| 2009/0169394 | A1 * | 7/2009 | Crow | B23K 26/389 219/69.17 |
| 2010/0228384 | A1 * | 9/2010 | Neumaier | G05B 19/4083 700/173 |
| 2011/0158820 | A1 | 6/2011 | Chamberlain et al. | |
| 2011/0185572 | A1 * | 8/2011 | Wei | B23K 26/389 29/418 |
| 2012/0184184 | A1 * | 7/2012 | Grosbois | B24B 1/04 451/75 |
| 2013/0206739 | A1 * | 8/2013 | Reed | B23B 35/00 219/121.71 |
| 2014/0097157 | A1 * | 4/2014 | Bolms | B23H 9/10 408/1 R |
| 2014/0271131 | A1 | 9/2014 | Moody et al. | |
| 2016/0074969 | A1 * | 3/2016 | Kriegmair | B23K 26/388 700/98 |
| 2016/0245092 | A1 * | 8/2016 | Rhodes | B23Q 15/22 |
| 2017/0232559 | A1 * | 8/2017 | Beck | B23K 26/0624 219/121.71 |
| 2017/0320163 | A1 * | 11/2017 | Hu | B23H 1/04 |
| 2017/0328217 | A1 * | 11/2017 | Gallier | B32B 38/10 |
| 2018/0099360 | A1 * | 4/2018 | Dong | B23H 9/10 |
| 2018/0128177 | A1 * | 5/2018 | Holland | F01D 25/12 |
| 2018/0156040 | A1 * | 6/2018 | Sonoo | F01D 5/186 |
| 2020/0001404 | A1 * | 1/2020 | Turcotte | F02C 7/24 |
| 2022/0032402 | A1 * | 2/2022 | Gaebelein | B23K 26/402 |

FOREIGN PATENT DOCUMENTS

| | | | | |
|---|---|---|---|---|
| CN | 106513986 | A * | 3/2017 | B23K 26/0093 |
| CN | 110640339 | A * | 1/2020 | |
| CN | 111375903 | A * | 7/2020 | B23K 26/36 |
| CN | 112008262 | A * | 12/2020 | |
| CN | 113020815 | A * | 6/2021 | |
| DE | 102005042270 | | 3/2007 | |
| DE | 202019100025 | U1 * | 2/2019 | |
| EP | 0366466 | | 5/1990 | |
| JP | H10249676 | A * | 9/1998 | |

OTHER PUBLICATIONS

CN-106513986-A machine translated description (Year: 2017).*
DE-202019100025-U1 machine translated description (Year: 2019).*
CN-112008262-A machine translation of description (Year: 2020).*
CN-110640339-A machine translation of description (Year: 2020).*
CN-111375903-A machine translation of description (Year: 2020).*
CN-113020815-A machine translation of description (Year: 2021).*
JP-H10249676-A Machine Translation (Year: 1998).*
European Search Report for European Patent Application No. 22215445.2 mailed May 22, 2023.

* cited by examiner

FABRICATION OF COOLING HOLES USING LASER MACHINING AND ULTRASONIC MACHINING

BACKGROUND

A gas turbine engine typically includes a fan section, a compressor section, a combustor section and a turbine section. Air entering the compressor section is compressed and delivered into the combustion section where it is mixed with fuel and ignited to generate a high-pressure and temperature exhaust gas flow. The high-pressure and temperature exhaust gas flow expands through the turbine section to drive the compressor and the fan section. The compressor section may include low and high pressure compressors, and the turbine section may also include low and high pressure turbines.

Airfoils in the turbine section and components in other hot sections of the engine are typically formed of a superalloy and may include thermal barrier coatings to extend temperature capability and lifetime. Ceramic materials (e.g., monolithic and ceramic matrix composites) are also being considered for these components. Among other attractive properties, ceramics have high temperature resistance. It has been a challenge, however, to develop efficient processes to machine features, such as cooling holes, into ceramic components.

SUMMARY

A method of machining cooling holes according to an example of the present disclosure includes providing a workpiece in which a cooling hole is to be formed. The cooling hole, once formed, defines distinct first and second sections. The workpiece is secured in a fixture that is mounted in a first machine and a laser is used to drill a through-hole in a wall of the workpiece. The through-hole is spatially common to the first and second sections of the cooling hole. After drilling the through-hole, the fixture is removed with the workpiece secured therein from the first machine and mounted in a second machine. The second machine uses ultrasonic machining to expand a portion of the through-hole to form the second section. An abrasive slurry used in the process is drained through the through-hole during the ultrasonic machining.

In a further embodiment of any of the foregoing embodiments, the through-hole is of constant cross-section along a longitudinal central axis of the through-hole.

In a further embodiment of any of the foregoing embodiments, the second section is of non-uniform cross-section along the longitudinal central axis.

A further embodiment of any of the foregoing embodiments includes providing a first computerized 3-dimensional model representing the cooling hole, and extracting from the first computerized 3-dimensional model a second computerized 3-dimensional model representing the through-hole.

In a further embodiment of any of the foregoing embodiments, the use of the laser includes scanning the laser across the workpiece in accordance with the second computerized 3-dimensional model to cause removal of material of the workpiece layer-by-layer.

In a further embodiment of any of the foregoing embodiments, the first machine and the second machine have a common type of chuck configured to receive the fixture.

A further embodiment of any of the foregoing embodiments includes determining compensated linear and rotational positions of the through-hole and using the compensated linear and rotational positions in the ultrasonic machining.

In a further embodiment of any of the foregoing embodiments, the laser is a water-jet guided laser.

In a further embodiment of any of the foregoing embodiments, the workpiece is ceramic.

A method of machining cooling holes according to an example of the present disclosure includes providing a ceramic airfoil in which cooling holes are to be formed. The cooling holes, once formed, each define distinct first and second sections. The ceramic airfoil is secured in a fixture that is mounted in a first machine and a laser is used to drill through-holes in the ceramic airfoil. Each of the through-holes is spatially common to the first and second sections of a respective one of the cooling holes. After drilling the through-holes, the fixture is removed from the first machine with the ceramic airfoil secured therein and mounted in a second machine. The second machine uses ultrasonic machining to expand a portion of each of the through-holes to form the second sections. An abrasive slurry used in the process is drained through the through-holes during the ultrasonic machining.

In a further embodiment of any of the foregoing embodiments, each of the through-holes is of constant cross-section along a longitudinal central axis of the through-hole.

In a further embodiment of any of the foregoing embodiments, the second section is of non-uniform cross-section along the longitudinal central axis.

A further embodiment of any of the foregoing embodiments includes providing a first computerized 3-dimensional model representing the cooling holes, and extracting from the first computerized 3-dimensional model a second computerized 3-dimensional model representing the through-holes.

In a further embodiment of any of the foregoing embodiments, the use of the laser includes scanning the laser across the ceramic airfoil in accordance with the second computerized 3-dimensional model to cause removal of material of the ceramic airfoil layer-by-layer.

In a further embodiment of any of the foregoing embodiments, the first machine and the second machine have a common type of chuck configured to receive the fixture.

A further embodiment of any of the foregoing embodiments includes determining compensated linear and rotational positions of the through-holes and using the compensated linear and rotational positions in the ultrasonic machining.

In a further embodiment of any of the foregoing embodiments, the laser is a water-jet guided laser.

The present disclosure may include any one or more of the individual features disclosed above and/or below alone or in any combination thereof.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
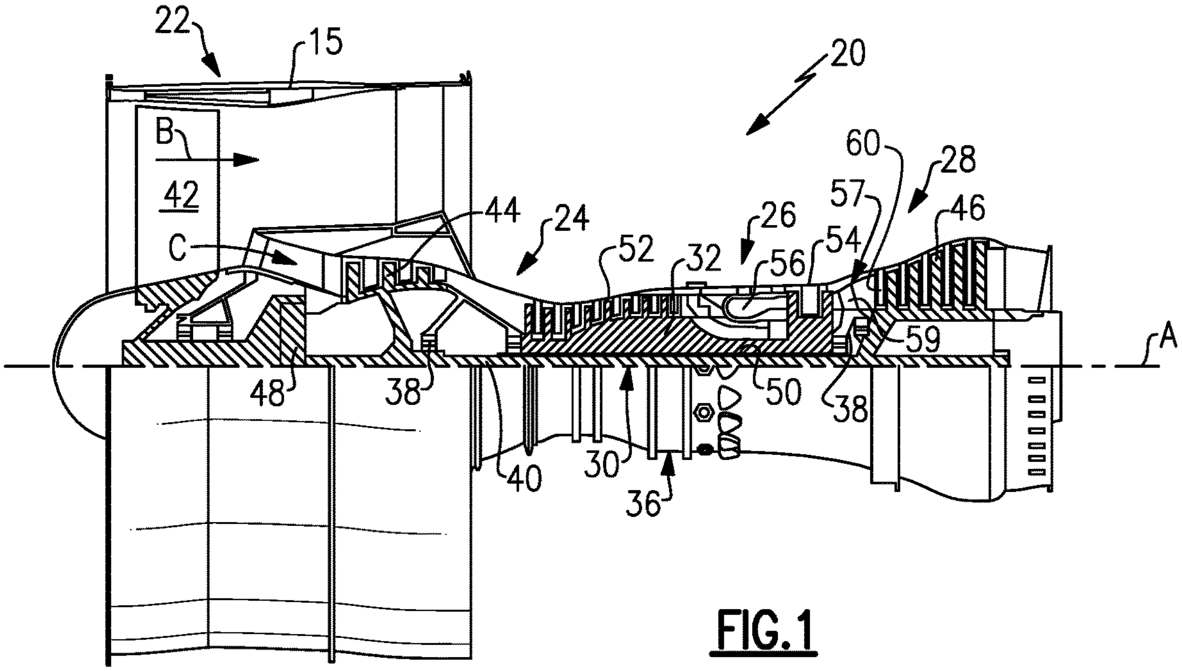
FIG. 1 illustrates a gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. The fan section 22 drives air along a bypass flow path B in a bypass duct defined within a housing 15 such as a fan case or nacelle, and also drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive a fan 42 at a lower speed than the low speed spool 30. The high speed spool 32 includes an outer shaft 50 that interconnects a second (or high) pressure compressor 52 and a second (or high) pressure turbine 54. A combustor 56 is arranged in the exemplary gas turbine 20 between the high pressure compressor 52 and the high pressure turbine 54. A mid-turbine frame 57 of the engine static structure 36 may be arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded through the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of the low pressure compressor, or aft of the combustor section 26 or even aft of turbine section 28, and fan 42 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), and can be less than or equal to about 18.0, or more narrowly can be less than or equal to 16.0. The geared architecture 48 is an epicyclic gear train, such as a planetary gear system or other gear system, with a gear reduction ratio of greater than about 2.3. The gear reduction ratio may be less than or equal to 4.0. The low pressure turbine 46 has a pressure ratio that is greater than about five. The low pressure turbine pressure ratio can be less than or equal to 13.0, or more narrowly less than or equal to 12.0. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to an inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1 and less than about 5:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10,668 meters). The flight condition of 0.8 Mach and 35,000 ft (10,668 meters), with the engine at its best fuel consumption—also known as "bucket cruise Thrust Specific Fuel Consumption ("TSFC")"—is the industry standard parameter of lbm of fuel being burned divided by lbf of thrust the engine produces at that minimum point. The engine parameters described above and those in this paragraph are measured at this condition unless otherwise specified. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45, or more narrowly greater than or equal to 1.25. "Low corrected fan tip speed" is the actual fan tip speed in ft/sec divided by an industry standard temperature correction of $[(\text{Tram } ^\circ \text{R})/(518.7^\circ \text{R})]^{0.5}$. The "Low corrected fan tip speed" as disclosed herein according to one non-limiting embodiment is less than about 1150.0 ft/second (350.5 meters/second), and can be greater than or equal to 1000.0 ft/second (304.8 meters/second).

Components in the engine 20, such as but not limited to, turbine blades, turbine vanes, blade outer air seals, and combustor panels, include cooling holes. The cooling holes are used to emit relatively cool air, such as bleed air from the compressor, to provide film cooling over the surface of the component. The cooling holes may be formed in a drilling operation. However, when the component is made of ceramic, such as monolithic ceramic or ceramic matrix composite (CMC), efficient drilling is a challenge because ceramics are extremely hard and brittle. The drilling of relatively deep, small-diameter holes is especially challenging. Ultrasonic machining and laser machining are under consideration for producing such features.

Ultrasonic machining involves the use of electrical energy to drive a transducer and produce mechanical vibrations along the axis of a tool at high frequency (e.g., 20-40 kHz). The vibration is transmitted through an energy-focusing horn to amplify the vibration amplitude and finally deliver vibration to the tool tip. An abrasive slurry (e.g., a mixture of abrasive particles, such as silicon carbide, boron carbide, etc., suspended in water or oil) is provided to the region being machined. The vibration of the tool causes the abrasive particles in the slurry between the tool and the workpiece to impact the workpiece surface and remove material by microchipping. The speed at which the workpiece can be machined depends on the vibration amplitude, abrasive particle concentration, and the size distribution of the abrasive particles. Ideally, if these parameters are kept constant, the machining speed should not vary with the penetration depth of the tool into the workpiece. In practice, however, the machining speed decreases significantly with increasing depth and, at approximately a 10 millimeter depth, may decline to close to zero. One reason for the decrease in machining speed is that the concentration of the abrasive particles in the region between the tool and the surface of the workpiece decreases. For instance, due to the depth of the hole, access to the region between the tool and the surface of the workpiece is limited and thus hinders removal of used slurry and introduction of fresh slurry. Additionally, the abrasive particles may be continuously broken down over time, and microchip debris may gradually accumulate. This decrease in machining speed may be mitigated to some extent by periodically lifting the tool and/or employing a special tool design. Nevertheless, mitigation techniques do not change the underlying nature of the dependence of machining speed on the cutting depth.

Laser machining, by comparison, involves ablation of the workpiece layer-by-layer through a series of passes to achieve material removal to a desired depth. In general, material removal can be controlled by the geometry and position of the laser tool, however, it is a challenge to determine the result of laser ablation with a high degree of accuracy. Computer simulations may be used to estimate the result, but uncertainty in laser ablation still remains and makes it difficult to generate accurate simulations and, in turn, accurate prediction of geometries for complex-geometry cooling holes.

In the above regards, each of ultrasonic machining and laser machining have drawbacks that heretofore have limited or prevented their application in ceramic workpieces. It has also been contemplated to use both of these machining techniques in attempt to realize the advantages of each while avoiding at least some of the drawbacks. In practicality, however, since these are two different processes on two different machines, there are compatibility issues that hinder harmonious use of these techniques together. As will be described below, the disclosed methodology facilitates overcoming such incompatibilities such that laser machining and ultrasonic machining may be used synergistically to produce cooling holes in ceramic components. As will also be appreciated, although the examples herein may be particularly directed ceramic components, the example may also be of benefit in the machining of metallic alloys.

Figure 2:
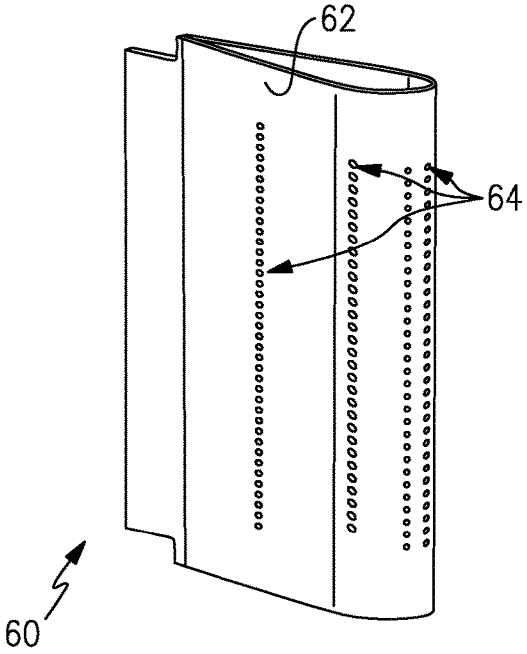
FIG. 2 illustrates a gas turbine engine component.

FIG. 2 illustrates an example ceramic component 60 of the engine 20. As shown, the ceramic component 60 is a turbine vane from the turbine section 28 of the engine 20. The ceramic component 60 includes component walls 62 and cooling holes 64 through the walls 62. For instance, the component 60 includes one or more internal cavities that are supplied with cooling air, which is subsequently emitted from the cooling holes 64. Although the examples herein may be in context of the ceramic turbine vane, the examples are also applicable to other engine components that include cooling holes, such as but not limited to, turbine blades, blade outer air seals, and combustor panels.

Figure 3A:
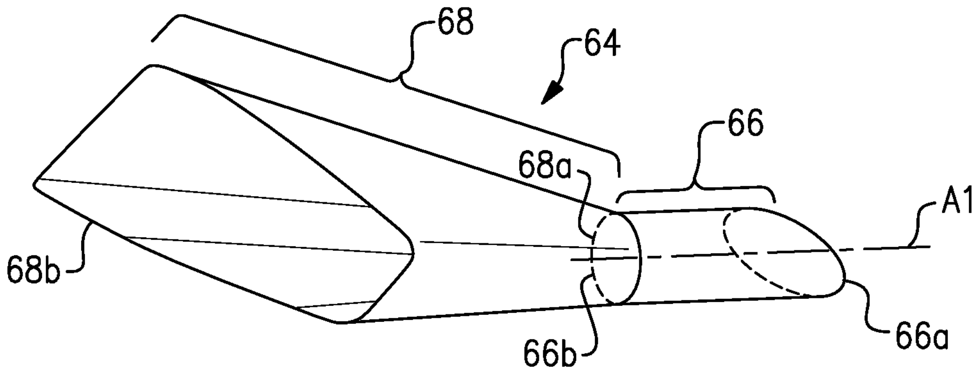
FIG. 3A illustrates a solid form of a cooling hole of the gas turbine engine component.
Figure 3B:
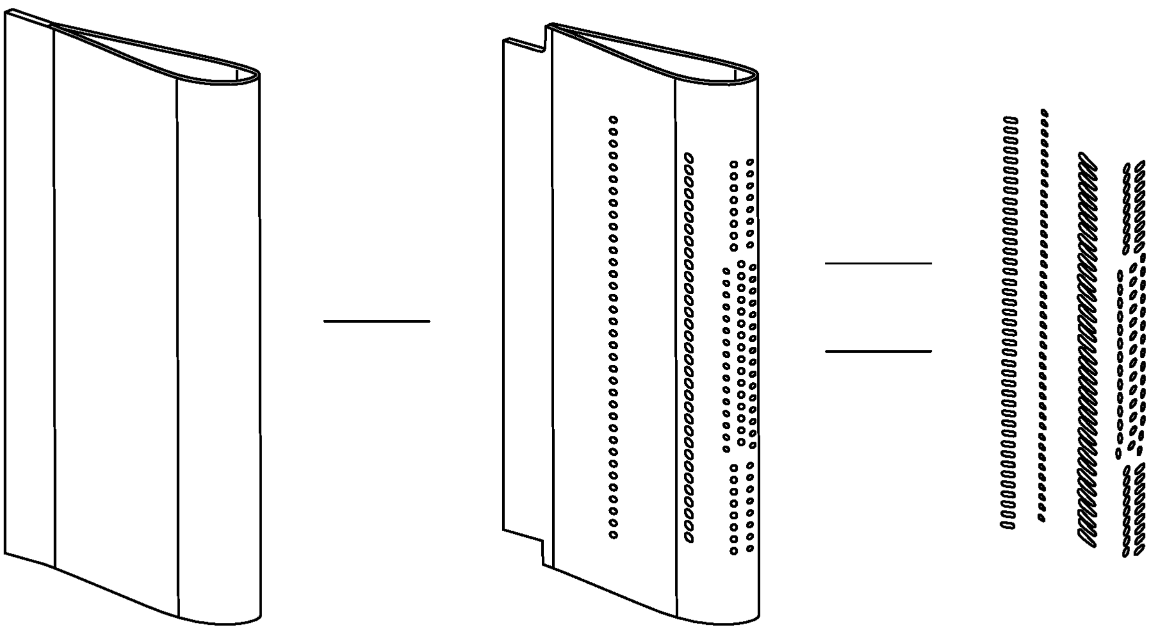
FIG. 3B illustrates generation of the solid form of the cooling hole.

FIG. 3A illustrates a solid form of a representative one of the cooling holes 64. As shown in FIG. 3B, the solid form of the cooing hole 64 may be generated in essence from the difference between a first computerized 3-dimensional model of the workpiece 60 with cooling holes 64 and a second computerized 3-dimensional model of the workpiece without the cooling holes 64 (e.g., by Boolean Subtraction).

The cooling hole 64 has at least two distinct sections, including a first section 66 and a second section 68. In this example, the first section 66 is a metering hole that is of uniform cross-section along central axis A1. The cross-section is circular but may alternatively be, but is not limited to, oval-shaped or funnel-shaped. The first section 66 has an inlet end 66*a* that opens to one of the internal cavities in the component 60 and an outlet end 66*b* that opens to the second section 68. The second section 68 has a non-constant cross-section that continually diverges along the axis A1 from an inlet end 68*a* that is coincident with the outlet end 66*b* of the first section 66 to an outlet end 68*b* that opens at the exterior surface of the component 60. The examples herein are also applicable to other geometries and, in particular, to relatively complex geometries that include two or more distinct sections of differing geometries.

Figure 4:
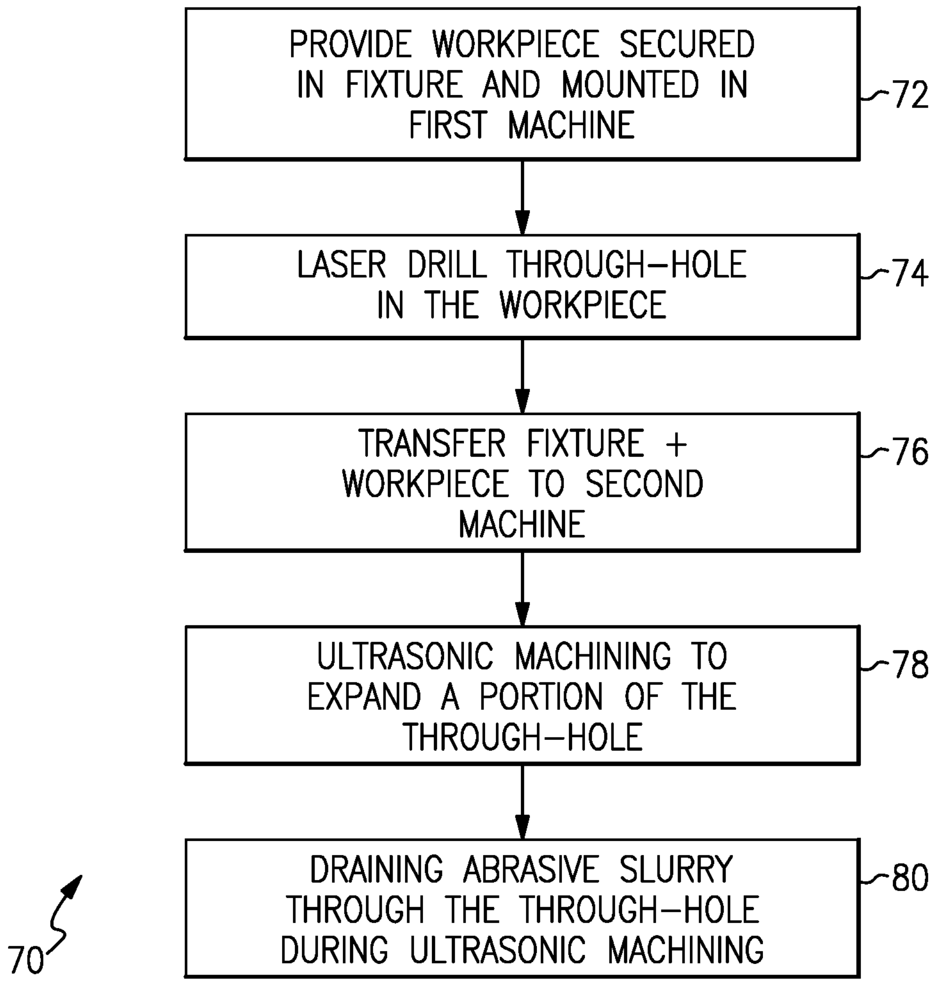
FIG. 4 illustrates a method of machining cooling holes.

FIG. 4 illustrates (in text) an example method 70 of machining the cooling holes 64 to produce the component 60. Aspects of the method 70 are also represented pictorially in FIG. 5. As shown in FIG. 4, the method 70 includes steps 72/74/76/78/80. Although the steps are distinctly identified for the description here, it is to be understood that these may be functionally combined, divided, and/or used with other intervening processing steps without departing from this disclosure.

At step 72 a workpiece (e.g., component 60 prior to formation of the cooling holes 64) is provided in which one or more of the cooling holes 64 are to be formed. The workpiece 60 is secured in a fixture (e.g., see fixture 82 in FIGS. 5 and 7) that is mounted in a first machine 84. Step 74 involves using a laser in the first machine 84 to drill a through-hole in the wall 62 of the workpiece 60. For instance, the through-hole is of constant cross-section along the axis A1. FIG. 6 illustrates an example through-hole 85 that is superimposed on the geometry of the cooling hole 64. The through-hole 85 is spatially common to the first and second sections 66/68 of the cooling hole 64. That is, the spatial region occupied by the through-hole 85 is substantially or fully within the spatial region that the cooling hole 64 is to occupy once fully formed.

Figure 5:
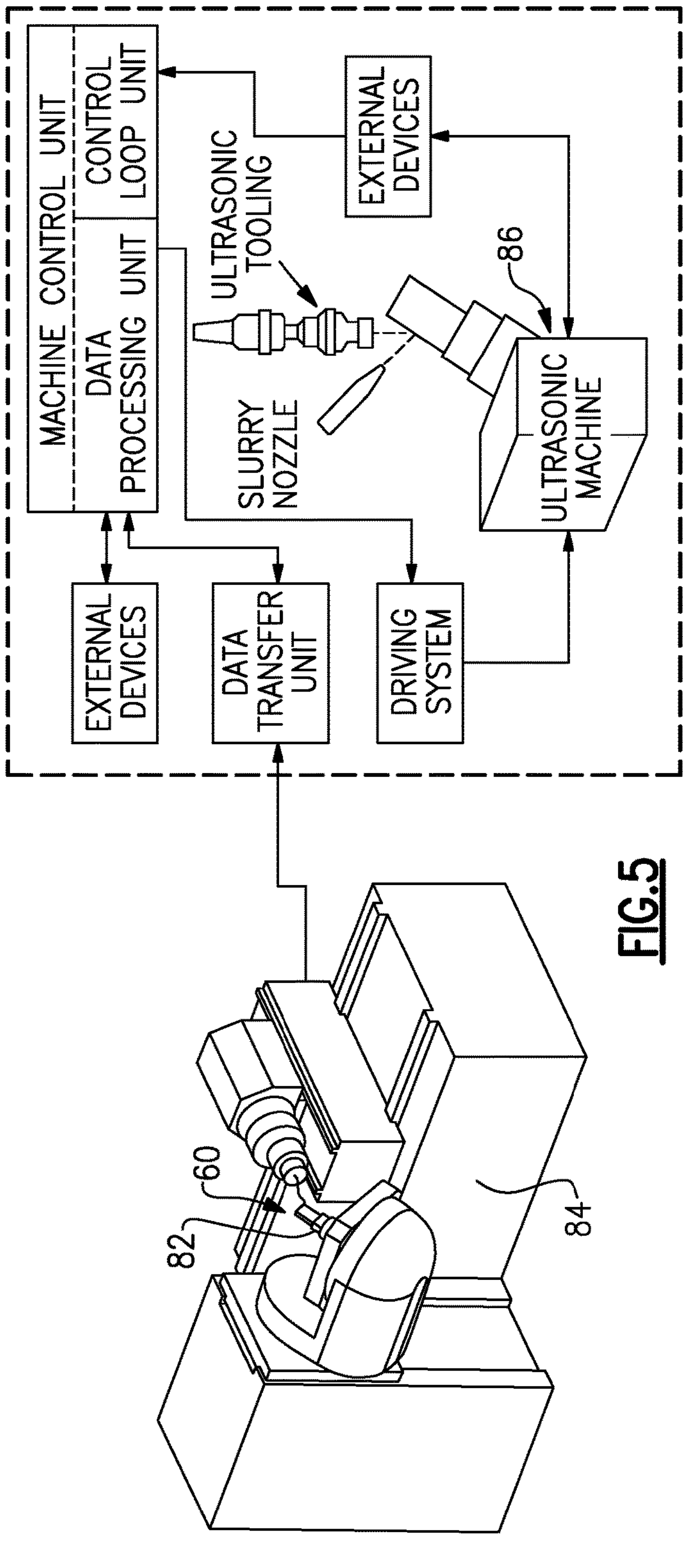
FIG. 5 pictorially illustrates aspects of the method of machining cooling holes.
Figure 6:
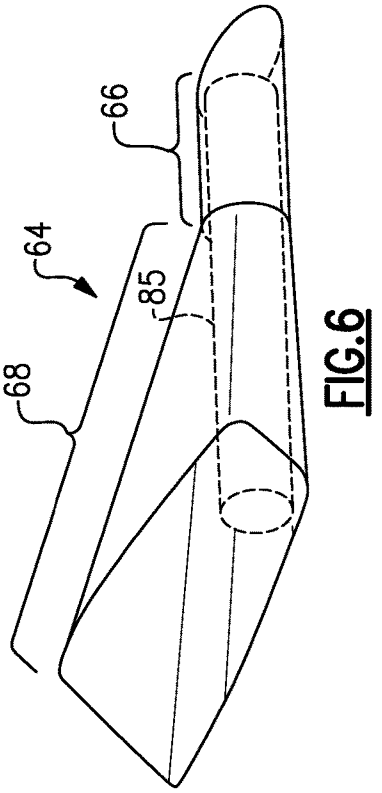
FIG. 6 illustrates a cooling hole with a through-hole superimposed thereon.

At step 76, after drilling the through-hole 85, the fixture 82 with the workpiece 60 secured therein is removed from the first machine 84 and mounted in a second machine 86 (FIG. 5). Step 78 then involves using ultrasonic machining in the second machine 86 to expand a portion of the through-hole 85 to form the second section 68 of the cooling hole 64. The ultrasonic machining may also be used to smooth the sides of the through-hole 85 as a finishing step for the first section 66 of the cooling hole 64. During the ultrasonic machining, an abrasive slurry is drained through the through-hole 85. The draining facilitates the clearing of used abrasive slurry and debris so that fresh abrasive slurry can be provided. Thus, the provision of the through-hole 85 in the earlier laser machining enables more efficient removal of material from the workpiece 60 during the later ultrasonic machining, thereby facilitating increased machining speeds.

Figure 7:
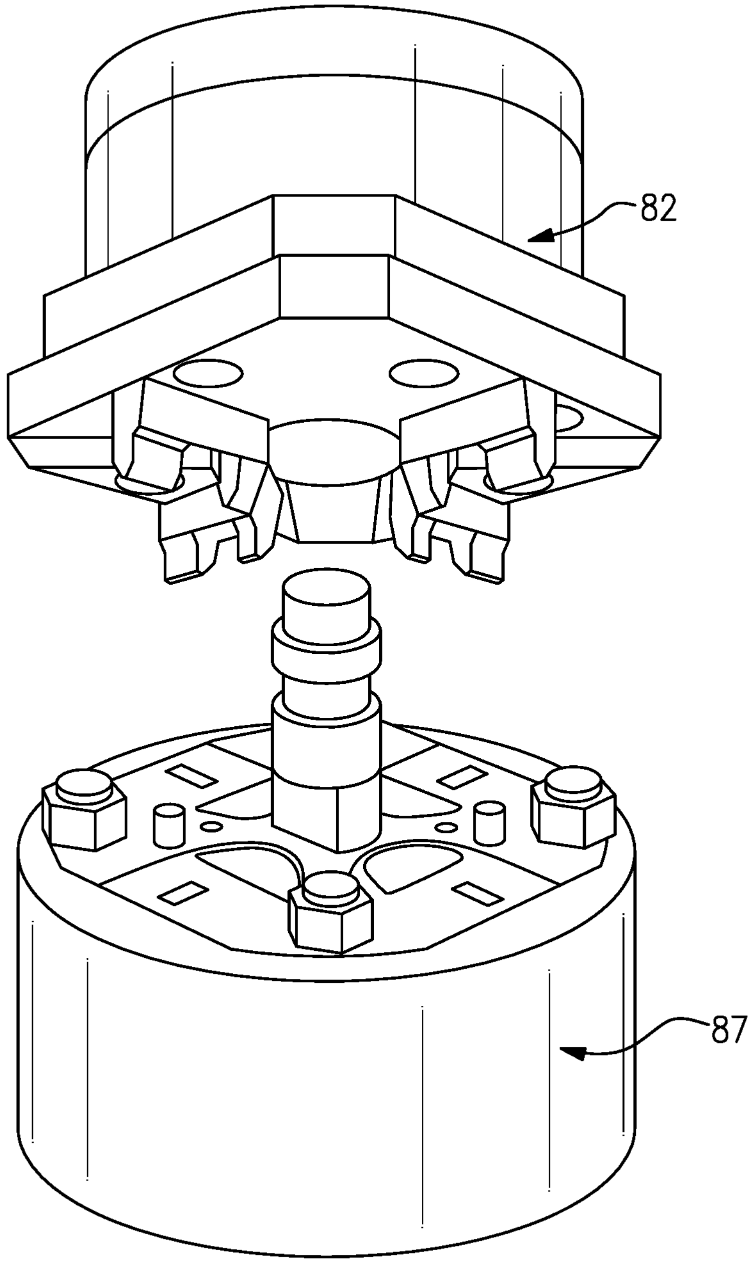
FIG. 7 illustrates a fixture for holding a workpiece and a chuck for holding the fixture.

FIG. 7 shows an example of the fixture 82 for securing the workpiece 60. Also shown is a common type of chuck 87 that is configured to receive the fixture 82. Each of the first and second machines 84/86 includes a chuck 87. As the type of chuck 87 is common, the fixture 82 can be mounted in each machine 84/86 without having to remove the workpiece 60 from the fixture 82. This facilitates maintaining accuracy in the ultrasonic machining in the second machine 86, as error of the position of the workpiece 60 relative to the fixture 82 is virtually eliminated.

Figure 8:
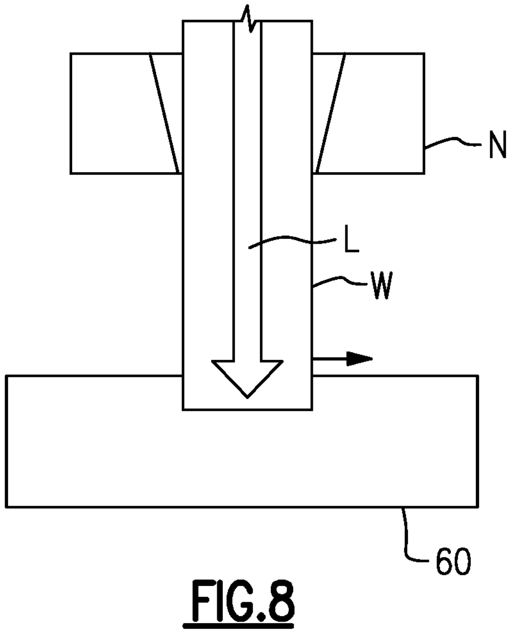
FIG. 8 illustrates a laser machining operation.
Figure 9:
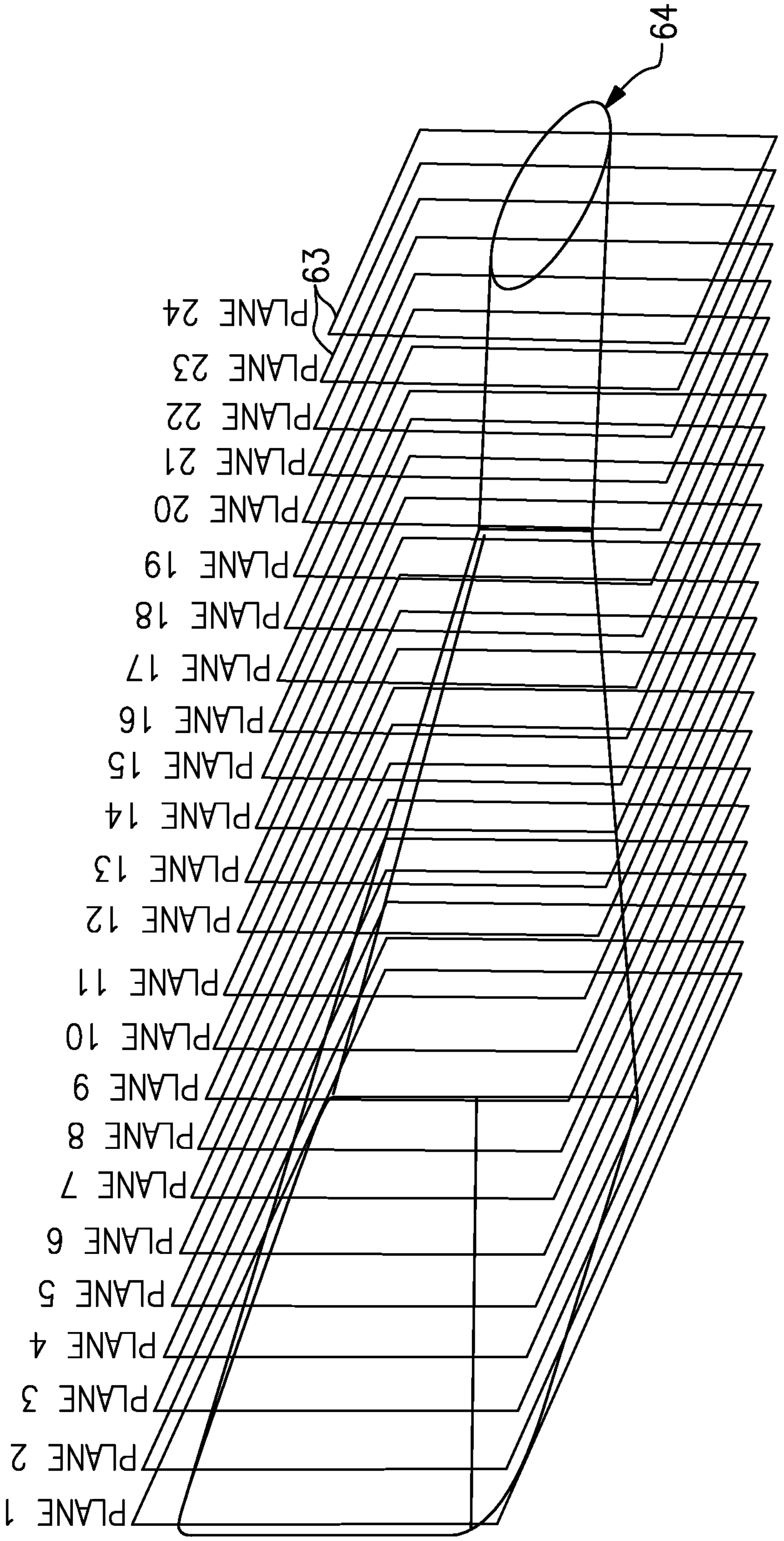
FIG. 9 illustrates an ultrasonic machining operation.

FIG. 8 illustrates an example of the laser drilling from the first machine 84, namely water-jet guided laser machining A jet of high-speed water W or other liquid medium is discharged through a nozzle N toward the workpiece 60. The jet of water W guides a laser beam L to the surface of the workpiece 60, where the laser beam ablates and removes material. The first machine 84 is programmed to scan the laser across the workpiece 60 according to a preset toolpath to remove material layer-by-layer to form the desired geometry of the through-hole 64. For instance, in order to generate the toolpath, the solid form of the cooing hole 64 described above may be partitioned into cross-sections 63, as illustrated in FIG. 9. The toolpath is then programmed for each cross-section 63 such that the laser cuts one cross-section by moving along a first toolpath and then cuts the next cross-section by moving over a second toolpath, and so on and so forth for each layer until the hole breaks through the wall 62 of the workpiece 60.

Figure 10:
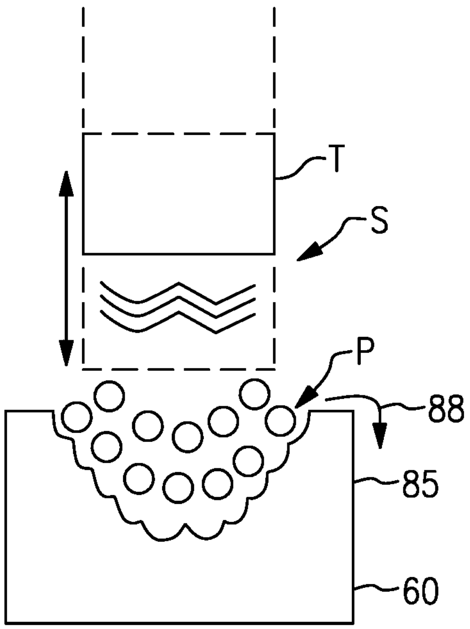
FIG. 10 illustrates transfer and alignment of a workpiece.

FIG. 10 illustrates an example of the ultrasonic machining from the second machine 86. A tool T is ultrasonically vibrated along the direction of the arrow (vertically in the figure). A slurry S with abrasive particles P is provided to the region between the tip of the tool (i.e., the horn) and the surface of the workpiece 60. As the tool vibrates, the abrasive particles are driven into the surface and cut away microchips of material from the surface, which are then carried away by the slurry that is drained from the region. A side of the through-hole 85 is also shown. The slurry is drained at 88 through the through-hole 85, thereby removing used slurry and debris from cutting region at the surface of the workpiece 60. This, in turn, enables new, fresh slurry to be provided to the region.

As indicated above, there are challenges to combining laser machining and ultrasonic machining. The through-hole 64 is one aspect that facilitates making these techniques compatible. For instance, as the through-hole 64 is spatially common to the first and second sections 66/68, it in essence serves as a geometric link between the two processes.

Figure 11:
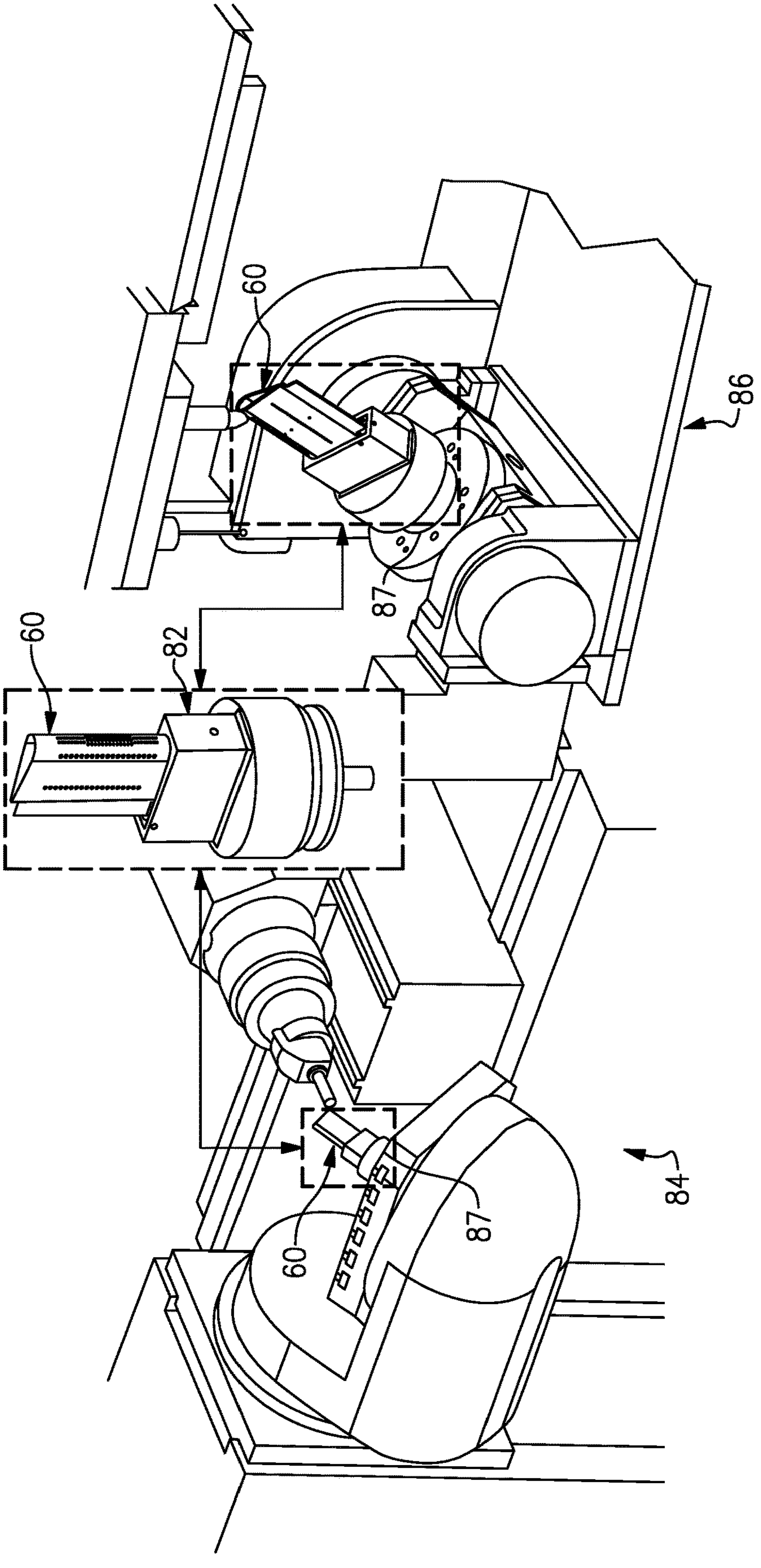
FIG. 11 illustrates alignment of a workpiece in a second machine when it is being transferred from a first machine 84 after drilling through-holes.

Another challenge is accurate and efficient alignment on the two separate machines 84/86. FIG. 11 illustrates the alignment of the workpiece 60 in the second machine 86 when it is being transferred from the first machine 84 after drilling the through-holes 85. For example, both machines 84/86 use the same chuck 87 such that after laser machining, the workpiece 60 can be kept in the fixture 82 and moved and mounted to the second machine 86. Thus, the position of the workpiece 60 with respect to the chuck 87 center is maintained. Thereafter, all machined features can be accurately and efficiently aligned between the two machining processes. For instance, all positions of cooling holes 64 can be referenced to the coordinate system of the fixture 82, which is defined by translationally moving the workpiece 60 coordinate system along both X and Z axis. After mounting the fixture 82 in the chuck 87 of the second machine 86, the machine controller determines the position all the cooling holes 64. For example, position data can be provided from the controller of the first machine 84 and used as a basis for determining the position in the second machine 86. The coordinate system of the second machine 86 is obtained by translationally moving the fixture 82 coordinate system along the Z-axis. Due to imperfections in manufacturing, the center of the rotary table on which the chuck 87 is secured and the center of the fixture 82 deviate from their nominal positions. These deviations tend to be larger further away from the center of the rotary table. The position of the workpiece 60 in the second machine 86 is defined with respect to the location of the fixture 82 on the rotary table. As the table rotates, the fixture 82 orbits around the center of the rotary table (and thus also the center of the workpiece 60). A new fixture offset is generated to create a workpiece coordinate system. For both machine imperfections and workpiece center deviations, the error components include offset along three translational and three rotary axes. A compensated tool position and direction is calculated from the setup error such that the tool position and direction on the workpiece coordinate system are maintained on the workpiece 60. Then, the machine controller determines compensated linear and rotating axis positions. Such calculations and compensations can be performed by the CNC controller of the machine. Thus, even with such a workpiece setup error, the cooling holes 64 can be machined accurately using the compensated linear and rotating axis positions.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A method of machining cooling holes, the method comprising: providing a ceramic airfoil in which cooling holes are to be formed, wherein the cooling holes once formed each define distinct first and second sections, the ceramic airfoil being secured in a fixture that is mounted in a first chuck of a first machine; generating a solid form model of each of the cooling holes from a difference between a first computerized 3-dimensional model of the workpiece with the cooling holes and a second computerized 3-dimensional model of the workpiece without the cooling holes; partitioning the solid form model of each of the cooling holes into cross-sections; in the first machine, using a laser to drill through-holes in the ceramic airfoil by scanning the laser across the ceramic airfoil along a toolpath in each of the cross-sections to cause removal of material of the ceramic airfoil layer-by-layer, each of the through-holes being spatially common to the first and second sections of a respective one of the cooling holes; reducing error of a position of the ceramic airfoil relative to the fixture due to manufacturing imperfections by, after drilling the through-holes, removing the fixture with the ceramic airfoil secured therein from the first machine and, without removing the ceramic airfoil from the fixture, mounting the fixture in a second chuck of a second machine, the first chuck and the second chuck being of common type such that the fixture is securable into both the first chuck and the second chuck, with the fixture mounted in the second chuck of the second machine, determining a compensated tool position, and performing ultrasonic machining based upon the compensated tool position; in the second machine, using the ultrasonic machining to expand a portion of each of the through-holes to form the second section; and draining an abrasive slurry through the through-holes during the ultrasonic machining.

2. The method as recited in claim 1, including determining compensated linear and rotational positions of the through-holes and using the compensated linear and rotational positions in the ultrasonic machining.

3. The method as recited in claim 1, wherein the laser is a water-jet guided laser.

4. The method as recited in claim 1, wherein positions of the through-holes in the ceramic airfoil in the fixture while in the first machine and while in the second machine are referenced to a coordinate system of the fixture.

5. The method as recited in claim 1, wherein each of the through-holes is of constant cross-section along a longitudinal central axis of the through-hole.

6. The method as recited in claim 5, wherein the second section is of non-uniform cross-section along the longitudinal central axis.

* * * * *